United States Patent [19]

Kerndlmaier

[11] Patent Number: 5,663,870
[45] Date of Patent: Sep. 2, 1997

[54] PRINTED CIRCUIT BOARD FOR CONNECTORS

[75] Inventor: Walter Kerndlmaier, Riemerlink, Germany

[73] Assignee: Krone Aktiengesellschaft, Berlin-Zehlendorf, Germany

[21] Appl. No.: 502,387

[22] Filed: Jul. 14, 1995

[30] Foreign Application Priority Data

Aug. 9, 1994 [DE] Germany .............. 94 12 794 U

[51] Int. Cl.$^6$ .................................................. H05K 1/00
[52] U.S. Cl. .................. 361/763; 361/748; 361/760; 361/777; 379/416; 379/417; 174/260; 174/261; 174/262
[58] Field of Search ............... 361/748, 741, 361/777, 763, 766, 782, 821; 379/416, 417, 3; 333/1, 4, 5, 260; 439/620, 922, 76.1

[56] References Cited

U.S. PATENT DOCUMENTS

| | | | |
|---|---|---|---|
| 3,973,817 | 8/1976 | Stalley et al. | 339/14 R |
| 4,831,497 | 5/1989 | Webster et al. | 361/406 |
| 5,079,069 | 1/1992 | Howard et al. | 428/209 |
| 5,163,855 | 11/1992 | Gerke et al. | 439/709 |
| 5,295,869 | 3/1994 | Siemon et al. | 439/620 |
| 5,431,584 | 7/1995 | Ferry | 439/620 |
| 5,432,484 | 7/1995 | Klas et al. | 333/1 |
| 5,435,752 | 7/1995 | Siemon et al. | 439/620 |
| 5,494,461 | 2/1996 | Bippus et al. | 439/709 |

FOREIGN PATENT DOCUMENTS

| | | | |
|---|---|---|---|
| 003539040 | 5/1987 | Germany | 361/748 |
| 43 25 952 A | 2/1995 | Germany | H01R 4/24 |

Primary Examiner—Leo P. Picard
Assistant Examiner—David Foster
Attorney, Agent, or Firm—McGlew and Tuttle

[57] ABSTRACT

A printed circuit board for connectors in symmetrical communications and data systems engineering distribution systems, which includes a pair of substantially parallel circuit board tracks on a front face thereof arranged substantially congruently with a pair of substantially parallel circuit board tracks of a back face of the printed circuit board, and wherein one of the pair of tracks on the back face crosses over the other track of the pair by means of two through-hole platings, which are electrically interconnected on the front face through an interconnecting circuit board track.

8 Claims, 2 Drawing Sheets

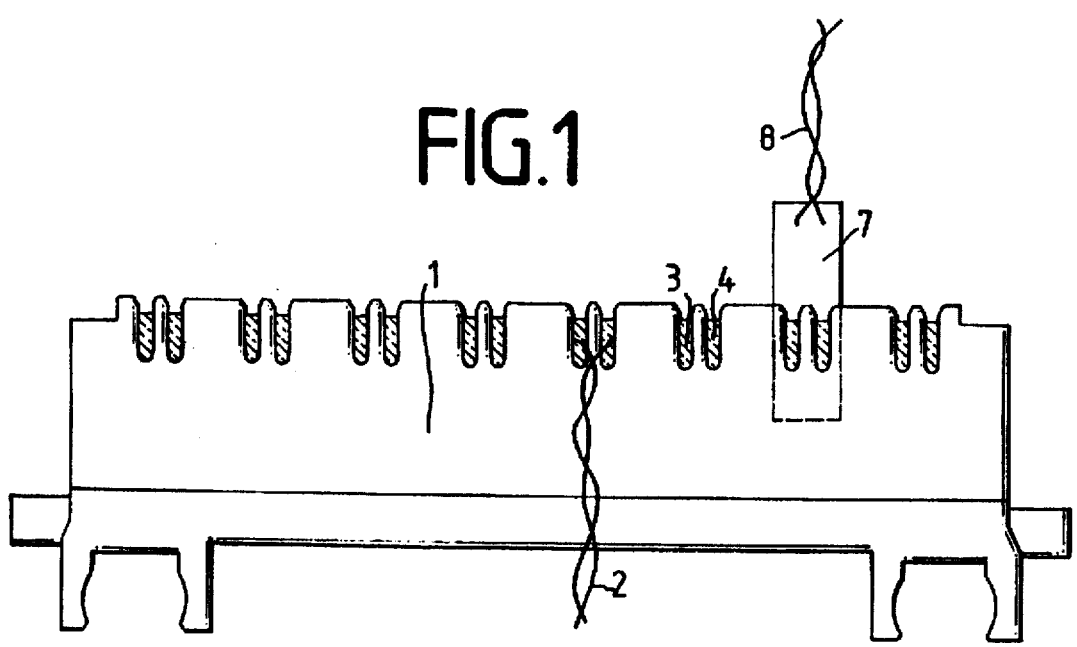
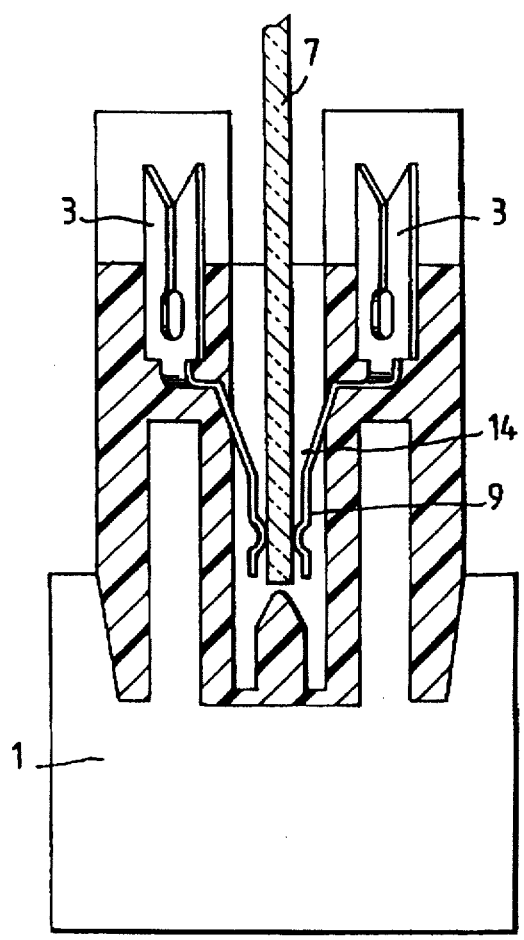

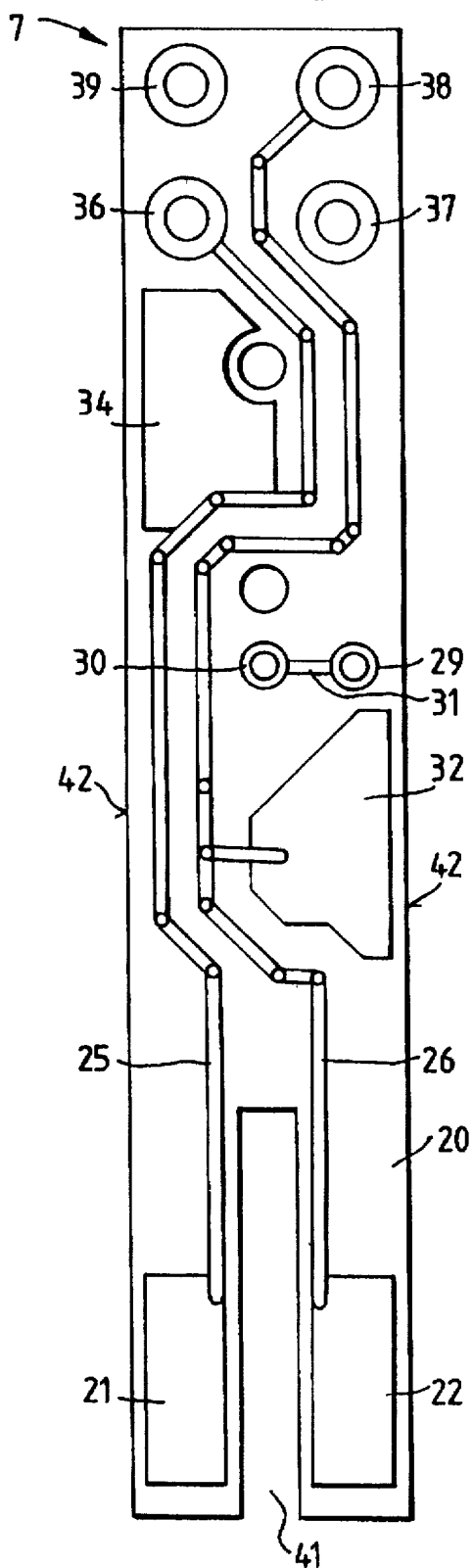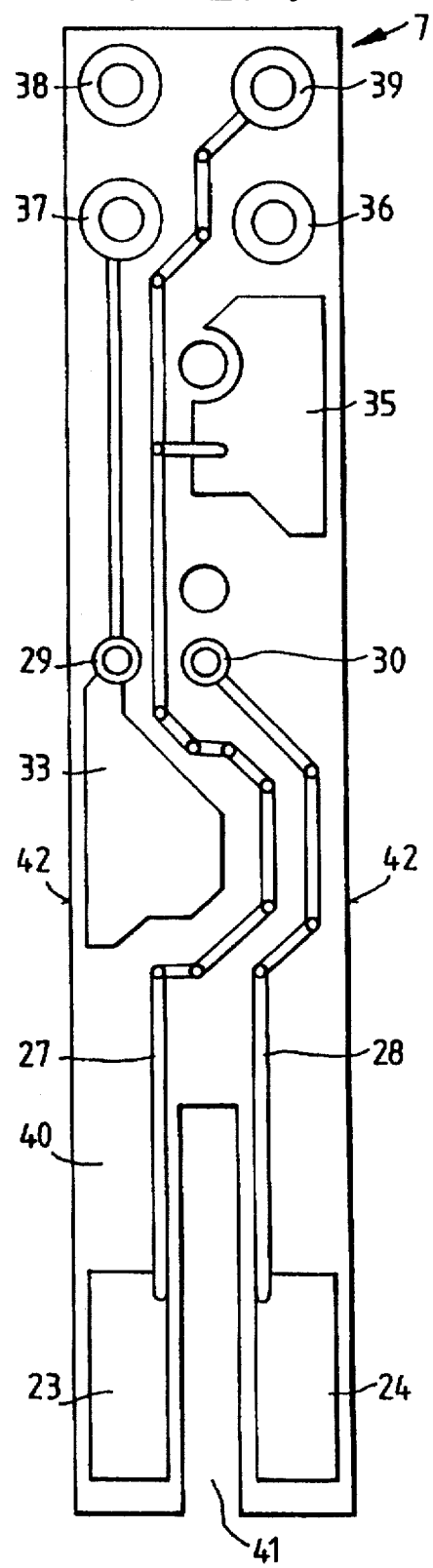

PRINTED CIRCUIT BOARD FOR CONNECTORS

FIELD OF THE INVENTION

The present invention relates to a printed circuit board for connectors in communications and data systems engineering distribution systems.

BACKGROUND OF THE INVENTION

The operating frequencies of up to 100 MHz occurring in current distribution systems require careful configuration of all components of the distribution system, especially also of the connectors in the patch fields. Three main demands are made on the transmission performance of the components, namely with respect to the insertion loss, terminal return loss and the cross-talk performance. Apart from cable attenuation, the cross-talk performance in particular is the factor which determines maximum transmission performance. For this reason, additional compensation measures, apart from an originally cross-talk-deficient design, are normally necessary in individual components. The requirements to be fulfilled by the components of commercial distribution systems are set out in the US standard ANSI/EIA/TIA-568 ("Commercial Building Telecommunications Wiring Standard") and the associated "Supplement Technical Systems Bulletin" (TIA/EIA TSB 40). Of special interest is category 5 of this standard, which requires of connectors a cross-talk attenuation (NEXT) of at least −40 dB between the individual board pairs at an operating frequency of 100 MHz. This requirement can barely be fulfilled any longer by standard connectors having even contact clearance and necessitates complicated board geometries or balancing circuits.

The specification of U.S. Pat. No. 5,295,869 discloses a connector in which a capacitive balancing of cross-talk occurs on an additional plate by means of closely adjoining through-hole platings. This same document also itemizes the other known possibilities for balancing the cross-talk, namely: use of discrete balancing capacitors, design of capacitive surfaces on associated printed circuit boards, inductive coupling by means of parallel conductivity on associated printed circuit boards, as well as additional balancing conductor sections.

The drawbacks to these known balancing processes for connectors are deficient compatibility of discrete balancing capacitors or additional balancing conductor sections, as well as increased manufacturing costs because of additionally required processes.

The specification of DE 43 25 952.9 discloses a contact board for distribution systems which enables cross-talk attenuation of better than −60 dB in a configuration as circuit board or terminal board by contraction of the contact clearance between both conductors of the twisted pairs with constant contact clearance between the different double wires. The disadvantage is that with this particular configuration of the contact board as disconnecting board, the cross-talk attenuation between opposite double wires rises to −40 dB during use of conventional connectors, accordingly requiring further balancing measures on the connector.

SUMMARY AND OBJECT OF THE INVENTION

It is an object of the invention to provide a printed circuit board for connection with connectors in communication and data system distribution systems, which circuit board provides good crosstalk performance.

In accordance with the present invention, there is provided printed circuit boards for connectors in symmetrical communications and data systems engineering distribution systems, comprising a pair of substantially parallel circuit board tracks on a front face thereof arranged substantially congruently with a pair of substantially parallel circuit board tracks of a back face of the printed circuit board, and wherein one of said pair of tracks on the back face crosses over the other track of the pair by means of two through-hole platings, which are electrically interconnected on the front face through an interconnecting circuit board track.

In embodiments of the invention, partly magnetic self-balance is achieved between the connector and the contact board, as is minimal cross-talk inside the connector on the basis of the configuration of the circuit board tracks. The magnetic self-balance occurs through circuit board track sections which run essentially parallel and closely adjacent to the contact springs of the contact board and are connected to the contact surfaces, whereas the cross-talk attenuation in the connector is minimized predominantly by the substantially congruent circuit board track design on the front and back of the printed circuit board.

Further advantageous developments of the present invention are noted herein. In particular, contraction of the parallel circuit board track design leads to adjustment of the resistance impedance to in the vicinity of 100 ohm, effectively avoiding reflections. Connection of the circuit board tracks with capacitive surfaces brings about an improved resistance impedance. In addition, these serve to balance the cross-talk between front and back of the printed circuit board and mainly balance out the influences of the contact surfaces. In order to balance undetected cross-talk of the contact board by magnetic self-balance, the capacitive surfaces are designed preferably somewhat larger than the associated contact surfaces.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 is a side view of a twisted pair connector block with inserted printed circuit board;

FIG. 2 is a sectional view of the connector block with inserted printed circuit board;

FIG. 3 is a plan view of a front face of the printed circuit board; and

FIG. 4 is a plan view of a back face of the printed circuit board.

DETAILED DESCRIPTION OF THE PREFERRED EMBODIMENT

A connector block 1 for distribution systems for use in communications and data systems engineering (e.g., communication applications) normally comprises a synthetic housing with matching recesses for terminal contacts 3, 4, as in FIG. 1. Each pair of terminal contacts 3, 4 serves to connect a twisted pair 2. In the symmetrically structured connector block 1 a pair of terminal contacts 3, 4 corresponds to an associated pair on the opposite side of the connector block. One side of the connector block 1 constitutes the cable side to which are connected double wires 2 coming from, for example, a telephone exchange, whereas on the opposite jumper side double wires 2 are connected for the callers. A connector can be inserted in a central aperture 14 for shunting of signals between the associated contacts or for measuring and testing purposes. Such a connector comprises a printed circuit board 7 and twisted pairs 8 of an interconnection cable soldered thereto. As shown in FIG. 2, contact springs 9 from two opposing terminal contacts 3 extend into the central aperture 14. In this embodiment the contact springs 9 form a break contact, that is, without an inserted connector therebetween the opposing terminal contacts 3 are electrically interconnected. When printed circuit board 7 of the connector is plugged into the break contact, the connection is interrupted. Twisted pairs 8 of the interconnection cable soldered to printed circuit board 7 are then tapped.

In its lower section, which is plugged into central aperture 14, printed circuit board 7 is designed with a slot 41, as shown in FIGS. 3 and 4. On each branch, contact surfaces 21, 22, 23, 24 are disposed on the front 20 and back 40 of printed circuit board 7. Attached thereto are associated circuit board tracks 25, 26, 27, 28 which run generally parallel to the longitudinal edge of the circuit board 7. After running approximately one third of the length of printed circuit board 7 circuit board tracks 25, 26, 27, 28 deviate towards the outer edge of printed circuit board 7, at which point circuit board tracks 25, 26 of front 20 run substantially congruently with circuit board tracks 27, 28 of the back. After this deviation circuit board tracks 25, 26 of front 20 and circuit board tracks 27, 28 of the back again run parallel to each other, though at a smaller distance apart. Positioned near circuit board track 26 is a capacitive surface 32 which is connected to circuit board track 26. Similarly, a capacitive surface 33 is positioned near circuit board track 27 on back 40 of printed circuit board 7, substantially congruently with capacitive surface 32.

By means of two through-hole platings 29, 30, which are electrically interconnected on front 20 through a circuit board track 31, circuit board track 28 on back 40 of printed circuit board 7 crosses circuit board track 27 and is connected to capacitive surface 33. Thereafter, circuit board tracks 27, 28 again continue parallel to each other and are finally connected to associated solder pads 37, 39. Arranged beneath solder pad 36 on back 40 of printed circuit board 7 is another capacitive surface 35 and attached to circuit board track 27. Positioned substantially congruently with capacitive surface 35 on back 40 of printed circuit board is a capacitive surface 34 on front 20 and attached to circuit board track 25.

After running approximately two thirds of the length of printed circuit board 7 circuit board tracks 25, 26 deviate to opposite longitudinal edge (42) of printed circuit board 7 and again run parallel to each other to eventually connect with associated solder pads 36, 38. Soldered to solder pads 36, 38 or 37, 39 are associated twisted pairs 8, on which the tapped signal can be forwarded. Contact surfaces 21, 22, 23, 24 create the electrical contact to contact springs 9 of terminal contacts 3, 4 in central aperture 14.

The parallel configuration of the circuit board tracks above contact surfaces 21, 22, 23, 24 has a partly magnetic self-balancing effect with contact springs 9 of connector block 1. The connecting parallel but closer together configuration of circuit board tracks minimizes cross-talk to neighboring connectors and enables resistance impedance for preventing reflections. The distance between circuit board tracks 25, 26 or 27, 28 in the closer area is designed preferably such that the thus formed double wire exhibits a resistance impedance close to 100 ohm. Because of the substantially congruent configuration of circuit board tracks and capacitive surfaces an exactly defined magnetic and electrical coupling is achieved between front 20 and back 40. And with the crossing of circuit board track 28 on back 40 of printed circuit board 7 after traversing approximately half of the length, where the circuit board tracks closely adjoin, of printed circuit board 7 there is consequently almost complete balancing of the cross-talk between front 20 and back 40. The respective flat designed capacitors 32, 33 or 34, 35 also contribute to balancing the cross-talk between front 20 and back 40 and mainly balance the influence of contact surfaces 21, 22 or 23, 24. Capacitive surfaces 32, 33 and 34, 35 are preferably somewhat larger than contact surfaces 21, 22, 23, 24 for the cross-talk of contact board 1 not detected by the magnetic self-balancing to be balanced.

Dividing up of the balancing into an inductive portion (parallel circuit board tracks closely adjoining and crossed over after half the length of the board) and a capacitive portion (capacitive surfaces 32, 33 and 34, 35) in the aforementioned ratio results eventually in good resistance impedance alignment and thus leads to smaller reflections, as would be the case for purely inductive or purely capacitive balancing.

While a specific embodiment of the invention has been shown and described in detail to illustrate the application of the principles of the invention, it will be understood that the invention may be embodied otherwise without departing from such principles.

What is claimed is:

1. Printed circuit boards for connectors in symmetrical communications and data systems engineering distribution systems, comprising:

a front face with an interconnecting circuit board track and a pair of substantially parallel circuit board tracks;

a back face with a pair of substantially parallel circuit board tracks, said back pair of substantially parallel circuit board tracks being substantially congruent with said front pair of substantially parallel circuit board tracks; and through-hole plating means including two through-hole platings for connecting a track of said back pair of tracks to said interconnecting circuit board track on said front face.

2. A printed circuit board according to claim 1, further comprising:

contact surfaces for each of said back pair of substantially parallel circuit board tracks and said front pair of circuit board tracks; and a slot separating tracks on said front and back.

3. A printed circuit board according to claim 2, wherein said circuit board tracks, starting from said contact surfaces, after extending substantially one third of a length of said printed circuit board, deviate from parallel, and then continue in parallel, but more closely adjoining.

4. A printed circuit board according to claim 1, further comprising: capacitive surface means including capacitive surface elements connected to each of said circuit board tracks.

5. A printed circuit board according to claim 2, wherein said capacitive surface elements are larger than associated said contact surfaces.

6. A printed circuit board according to claim 5, wherein said capacitive surface elements are larger than associated said contact surfaces.

7. A printed circuit board according to claim 4, wherein capacitive surfaces connected to first ones of respective tracks of said front and back pairs of circuit board tracks are arranged approximately centrally of said printed circuit board and capacitive surfaces connected to second ones of said respective tracks, of said pairs of circuit board tracks are arranged adjacent to solder pads, said solder pads being provided on an end of said circuit board, opposite said contract surfaces.

8. A printed circuit board according to claim 7, wherein said circuit board tracks, starting from said contact surfaces and after extending substantially one third of a length of said printed circuit board deviate towards a longitudinal edge, over a deviation zone and continue in parallel, parallel to said longitudinal edge, more closely adjoining, whereby said circuit board front pair of tracks, after running approximately two-thirds of a length of said circuit board, deviate towards a first angle of deviation, then run vertically to a longitudinal edge, deviate again vertically to said solder pads to become connected with associated solder pads, and said circuit board track, after running approximately half a length of said circuit board, deviates towards said first angle of deviation and subsequently crosses the other circuit board track, following an angled course, by means of through-hole platings, in order to subsequently continue in parallel to said longitudinal edge and to be finally connected with associated solder pads.

* * * * *